(12) United States Patent
Fang et al.

(10) Patent No.: US 11,417,987 B2
(45) Date of Patent: Aug. 16, 2022

(54) MAGNETIC MATRIX CONNECTOR FOR HIGH DENSITY, SOFT NEURAL INTERFACE

(71) Applicant: Northeastern University, Boston, MA (US)

(72) Inventors: Hui Fang, Brookline, MA (US); Yi Qiang, Malden, MA (US); Xun Han, Beijing (CN); Kyung Jin Seo, Boston, MA (US)

(73) Assignee: Northeastern University, Boston, MA (US)

( * ) Notice: Subject to any disclaimer, the term of this patent is extended or adjusted under 35 U.S.C. 154(b) by 44 days.

(21) Appl. No.: 17/103,425

(22) Filed: Nov. 24, 2020

(65) Prior Publication Data

US 2021/0194177 A1 Jun. 24, 2021

Related U.S. Application Data (60) Provisional application No. 62/939,884, filed on Nov. 25, 2019.

(51) Int. Cl.
*H01R 13/62* (2006.01)
*H05K 1/11* (2006.01)
(Continued)

(52) U.S. Cl.
CPC ......... *H01R 13/6205* (2013.01); *H01R 12/79* (2013.01); *H01R 12/85* (2013.01); *H01R 43/26* (2013.01); *H05K 1/118* (2013.01); *H01R 2201/12* (2013.01); *H05K 1/0283* (2013.01); *H05K 1/18* (2013.01); *H05K 2201/0108* (2013.01); *H05K 2201/08* (2013.01);
(Continued)

(58) Field of Classification Search
CPC .... H01R 13/6205; H01R 12/79; H01R 12/85; H01R 43/26
USPC ............................................................ 439/39
See application file for complete search history.

(56) References Cited

U.S. PATENT DOCUMENTS 5,500,280 A * 3/1996 Yamazaki .......... H01R 13/2414
428/221
6,541,896 B1 * 4/2003 Piel, Jr. ................. B06B 1/0622
310/334

(Continued)

*Primary Examiner* — Alexander Gilman
(74) *Attorney, Agent, or Firm* — Foley Hoag LLP; Dana M. Gordon; Rajesh Vallabh (57) ABSTRACT

A soft neural interface connector apparatus includes a PCB having a two-dimensional array of solder balls, a transparent top board, a cushioning layer on one side of the transparent top board, and a soft neural interface including a flexible and/or stretchable microelectrode array (MEA) through which neural signals are obtained or delivered. The MEA includes a two-dimensional array of contact pads corresponding to the array of solder balls. The PCB, the transparent top board, the cushioning layer, and the MEA are stacked together such that the MEA is between the cushioning layer and the PCB, and the contact pads are aligned with and in electrical contact with associated solder balls. A magnetic connector system having at least one magnetic connector component on the transparent top board is magnetically connected with at least one magnetic connector component on the PCB to press the contact pads and associated solder balls together.

20 Claims, 8 Drawing Sheets

(51) Int. Cl.
*H01R 12/79* (2011.01)
*H01R 43/26* (2006.01)
*H01R 12/85* (2011.01)
*H05K 1/18* (2006.01)
*H05K 1/02* (2006.01)

(52) U.S. Cl.
CPC .............. *H05K 2201/09063* (2013.01); *H05K 2201/10189* (2013.01); *H05K 2201/10234* (2013.01); *H05K 2201/10378* (2013.01); *H05K 2201/10393* (2013.01); *H05K 2201/2009* (2013.01)

(56) References Cited

U.S. PATENT DOCUMENTS

| | | | | |
|---|---|---|---|---|
| 8,886,334 | B2* | 11/2014 | Ghaffari | A61B 5/145 607/115 |
| 9,409,011 | B2* | 8/2016 | Tai | A61N 1/0551 |
| 9,437,554 | B2* | 9/2016 | Ji | H01L 23/562 |
| 9,742,088 | B1* | 8/2017 | Pickel | H01R 13/6471 |
| 9,955,886 | B2* | 5/2018 | Liu | A61N 1/36031 |
| 10,617,011 | B2* | 4/2020 | Tai | H05K 3/242 |
| 10,638,933 | B2* | 5/2020 | Roukes | A61B 5/4064 |
| 11,160,926 | B1* | 11/2021 | Halac | A61B 5/14532 |
| 11,185,271 | B2* | 11/2021 | Negi | A61N 1/0551 |
| 2002/0177345 | A1* | 11/2002 | Daugherty, Jr. | H01R 12/52 439/329 |
| 2003/0215678 | A1* | 11/2003 | Barton | H01M 8/0269 429/465 |
| 2007/0161265 | A1* | 7/2007 | Wang | H05K 7/1061 439/66 |
| 2008/0113524 | A1* | 5/2008 | Ha | H01R 13/2407 439/39 |
| 2009/0103273 | A1* | 4/2009 | Costello | H05K 7/142 361/756 |
| 2010/0029148 | A1* | 2/2010 | Perlin | A61B 5/685 439/884 |
| 2010/0040896 | A1* | 2/2010 | Kosowsky | C25D 5/02 428/411.1 |
| 2015/0130075 | A1* | 5/2015 | Ji | H01L 23/562 257/734 |
| 2017/0214176 | A1* | 7/2017 | Kim | H05K 1/116 |
| 2017/0354031 | A1* | 12/2017 | Aoki | H05K 3/341 |
| 2018/0067075 | A1* | 3/2018 | Racz | A61N 1/0529 |
| 2018/0353750 | A1* | 12/2018 | Hetke | A61B 5/287 |
| 2019/0103349 | A1* | 4/2019 | Viswanath | H01R 13/2442 |
| 2019/0252102 | A1* | 8/2019 | Marin | H01R 24/16 |
| 2020/0185490 | A1* | 6/2020 | Seidemann | H01L 21/565 |
| 2020/0359921 | A1* | 11/2020 | Manoli | A61B 5/24 |
| 2021/0194177 | A1* | 6/2021 | Fang | H01R 13/6205 |
| 2021/0249322 | A1* | 8/2021 | Lin | H01L 23/42 |
| 2021/0280463 | A1* | 9/2021 | Ecton | H01L 23/528 |

\* cited by examiner

MAGNETIC MATRIX CONNECTOR FOR HIGH DENSITY, SOFT NEURAL INTERFACE

CROSS REFERENCE TO RELATED APPLICATIONS

This application claims priority from U.S. Provisional Patent Application No. 62/939,884 filed on Nov. 25, 2019 entitled MAGNETIC MATRIX CONNECTOR FOR HIGH DENSITY, SOFT NEURAL INTERFACE, which is hereby incorporated by reference.

STATEMENT AS TO FEDERALLY SPONSORED RESEARCH

This invention was made with government support under Grant No. W81XWH-18-1-0699 awarded by the US Army Medical Research and Development Command. The government has certain rights in the invention.

BACKGROUND

The present application relates generally to a soft neural interface connector for a high-density, soft neural interface such as neural microelectrode arrays (MEA). Connectors are needed to interface the soft devices and rigid measuring electronics. Currently available strategies include Anisotropic (ACF) cables, Zero Insertion Force (ZIF) connectors, wire bonding, soldering, etc. However, those techniques all have their limitations, especially when the number and density of the device channels are scaled up. For example, the width of ACF/ZIF connectors needs be extremely long to have over hundreds of channels. The soldering/wire bonding approaches are permanent to the devices; one will not be able to detach the connector from devices without causing damage. A connector with high scalability and reusability would be a very useful tool for the state-of-the-art high density, soft neural interfaces.

BRIEF SUMMARY OF THE DISCLOSURE

In accordance with one or more embodiments, a soft neural interface connector apparatus includes a printed circuit board (PCB) having a two-dimensional array of solder balls, a transparent top board, a cushioning layer on one side of the transparent top board, and a soft neural interface including a flexible and/or stretchable microelectrode array (MEA) through which neural signals are obtained or delivered. The MEA includes a two-dimensional array of contact pads corresponding to the array of solder balls. The PCB, the transparent top board, the cushioning layer, and the MEA are stacked together such that the MEA is between the cushioning layer and the PCB, and the contact pads are aligned with and in electrical contact with associated solder balls. A magnetic connector system having at least one magnetic connector component on the transparent top board is magnetically connected with at least one magnetic connector component on the PCB to press the contact pads and associated solder balls together.

In accordance with one or more further embodiments, a method is disclosed for removably connecting a neural interface to a PCB, wherein the PCB has a two-dimensional array of solder balls on one surface thereof, and wherein the neural interface includes a soft microelectrode array (MEA) through which neural signals are obtained or delivered. The MEA includes a two-dimensional array of contact pads corresponding to the two-dimensional array of solder balls on the PCB. The method comprises the steps of: (a) placing a cushioning layer on one side of the transparent top board; (b) stacking the PCB, the MEA, and the transparent top board with the cushioning layer together such that the MEA is between the cushioning layer and the PCB, and wherein the contact pads in the array of contact pads are aligned with and in electrical contact with associated solder balls in the array of solder balls; and (c) magnetically securing the PCB, the transparent top board with the cushioning layer, and the MEA together in a stacked arrangement to press the contact pads of the MEA and associated solder balls on the PCB together.

BRIEF DESCRIPTION OF THE DRAWINGS

Like or identical reference numbers are used to identify common or similar elements.

DETAILED DESCRIPTION

Figure 1:
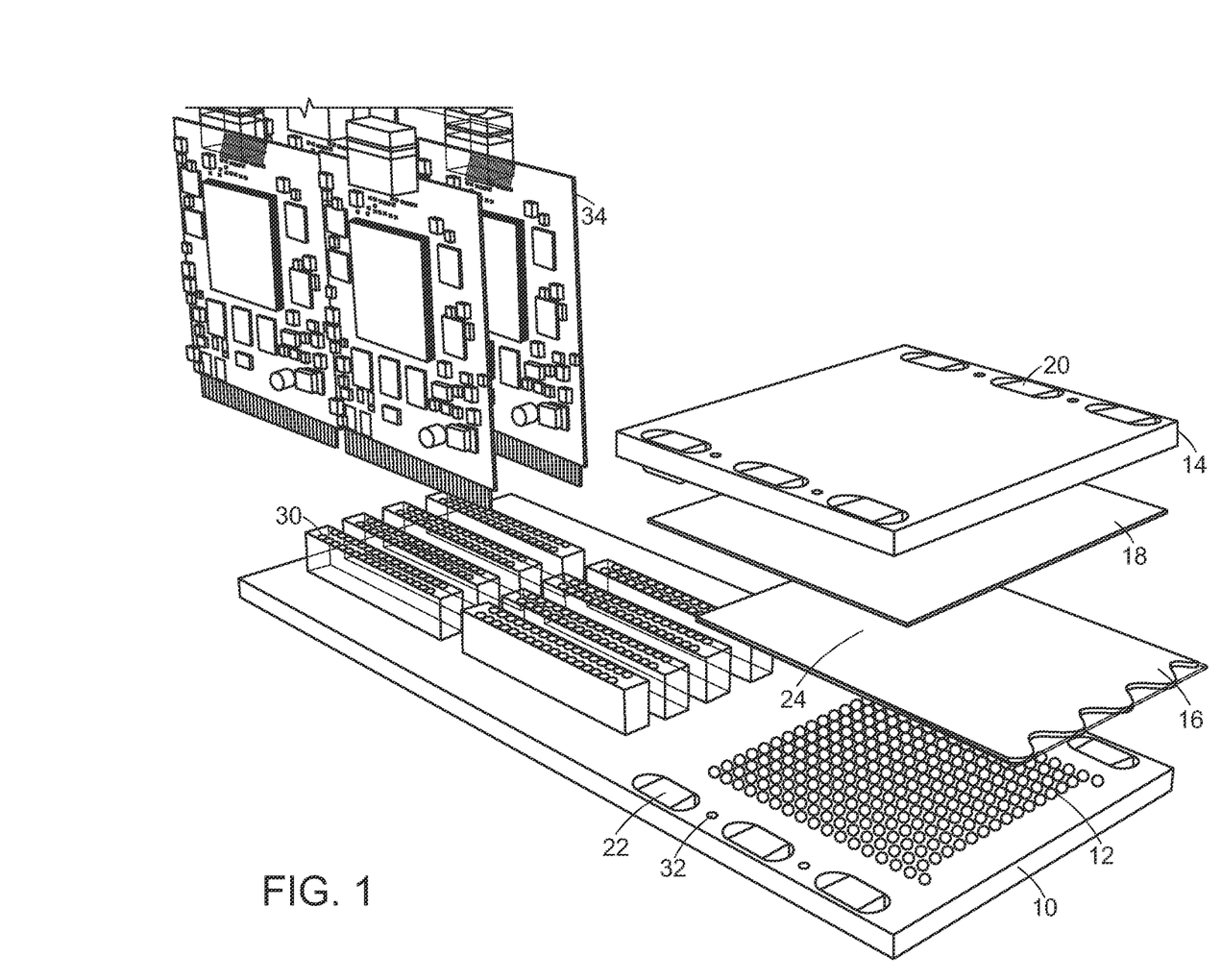
FIG. 1 is an exploded view of an exemplary soft neural interface connector apparatus in accordance with one or more embodiments.

FIG. 1 is an exploded view of an exemplary soft neural interface connector apparatus in accordance with one or more embodiments. The apparatus includes a printed circuit board (PCB) 10 having a two-dimensional array of solder balls 12, a transparent top board 14, a cushioning layer 18 on one side of the transparent top board 14, and a soft neural interface including a flexible and/or stretchable microelectrode array (MEA) 16 through which neural signals are obtained or delivered. The MEA 16 includes a two-dimensional array of I/O contact pads 24 corresponding to the array of solder balls 12. Pads on the bottom PCB board surface are bumped with the solder ball array 12 to contact the contact pads of flexible MEA 16 electrically.

The PCB 10, the transparent top board 14, the cushioning layer 18, and the MEA 16 are stacked together such that the MEA 16 is sandwiched between the cushioning layer 18 and the PCB 10, and the contact pads 24 are aligned with and in electrical contact with associated solder balls 12.

A magnetic connector system having at least one magnetic connector component 20 on the transparent top board 14 is magnetically connected with at least one magnetic connector component 22 on the PCB 10 to press the contact pads and associated solder balls 12 together. The magnetic force secures the electrical contact between the solder ball array 12 and flexible MEA 16. The magnetic connector components 20, 22 can include permanent magnets or a combination of at least one permanent magnet and at least one ferromagnetic piece.

The top board 14 can comprise a transparent polycarbonate material. Transparency assists users in aligning the solder ball array 12 to the MEA pads 24.

The cushioning layer 18 can comprise a silicone rubber cushioning layer 18 that is spin-coated on the top board 14 to help laminate the MEA 16 on board. The cushioning layer 18 can also function as a buffer layer to mitigate the pressure applied to the MEA pads.

FIGS. 2A-2F illustrate an exemplary process of assembling a soft neural interface connector apparatus in accordance with one or more embodiments.

Figure 2A:
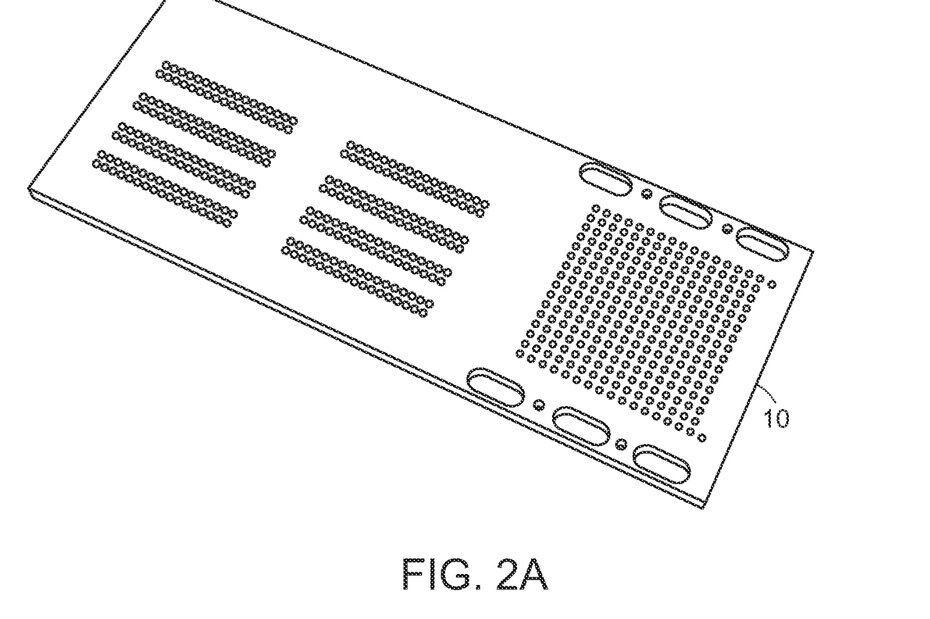
FIGS. 2A-2F illustrate an exemplary process of assembling a soft neural interface connector apparatus in accordance with one or more embodiments.

A multiple layer PCB 10 is manufactured as depicted in FIG. 2A.

Figure 2B:
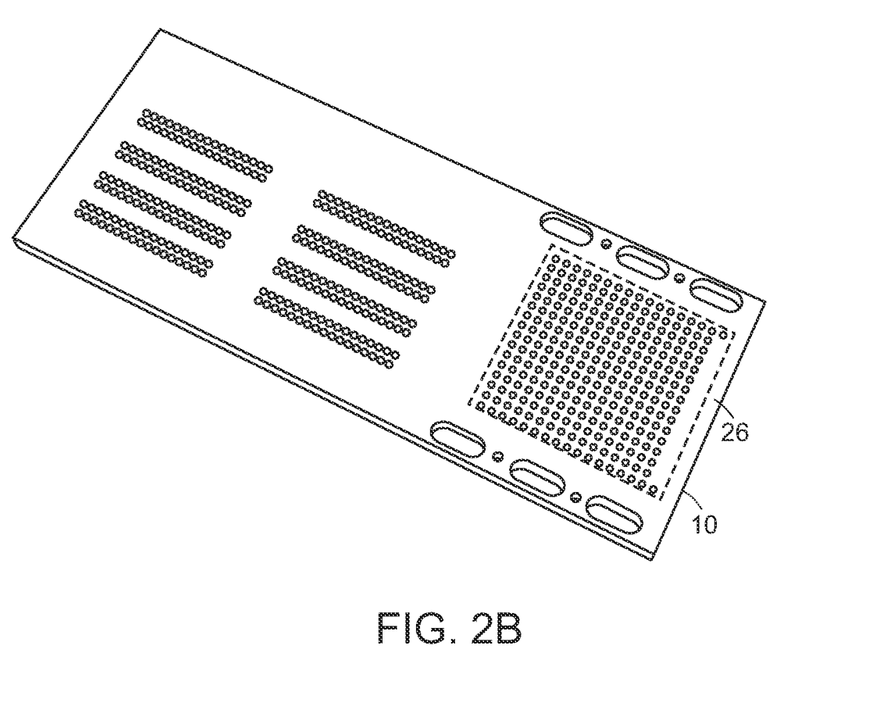

To enable the solder ball bumping, which requires a flat, conductive surface on the PCB 10, vias drilled on the PCB 10 are filled with conductive resin as depicted at 26 in FIG. 2B. The surface is then electroplated to ensure a sufficient flatness.

Figure 2C:
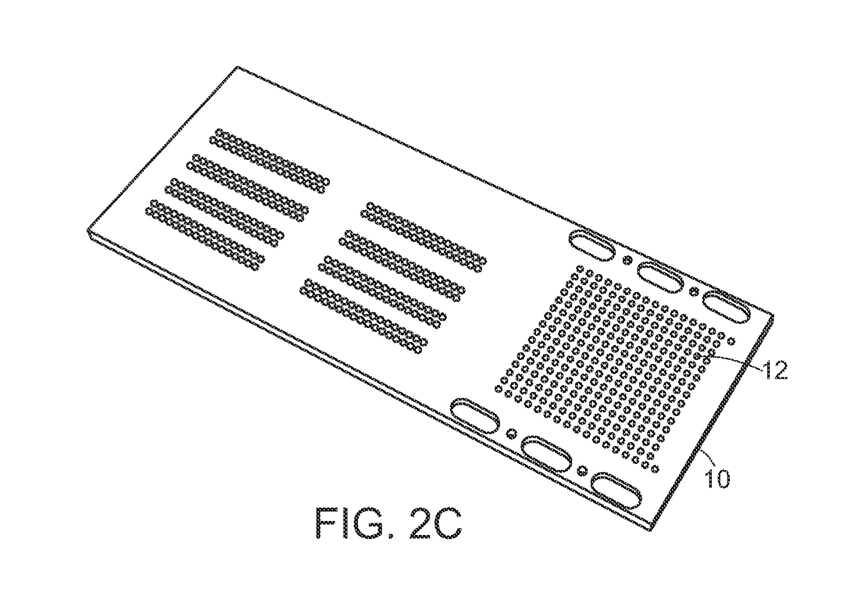

Solder balls 12 are reflowed on the electroplated pads, which results in a 12-mil height as depicted in FIG. 2C.

Figure 2D:
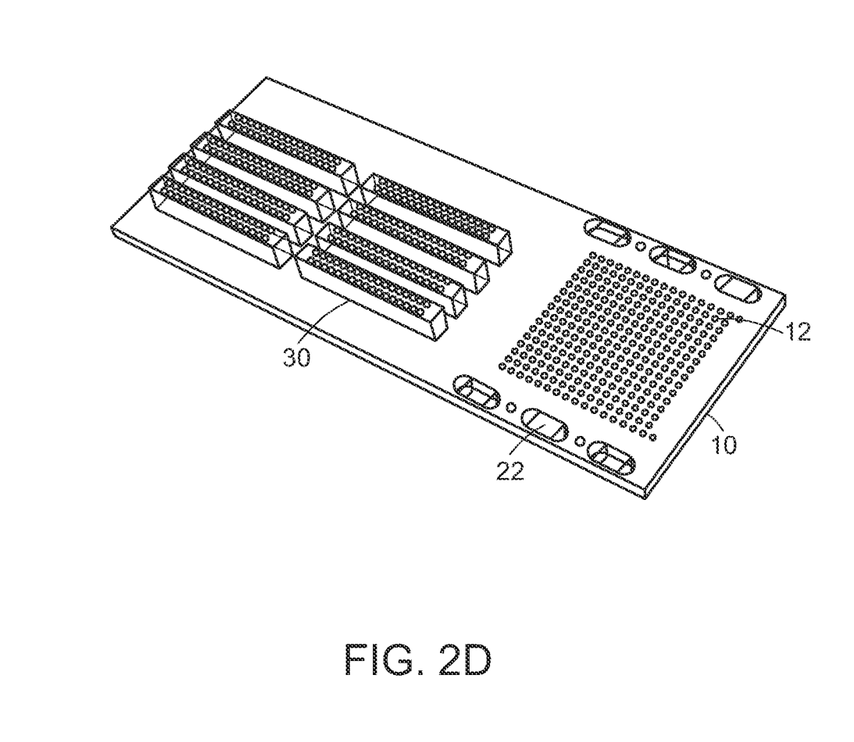

Then, a set of connectors 30 (e.g., from Omnetics) are soldered into the vias at the other end of PCB 10. Also, magnet cubes are inserted into the slots to form the magnetic components 22 as depicted in FIG. 2D.

Figure 2E:
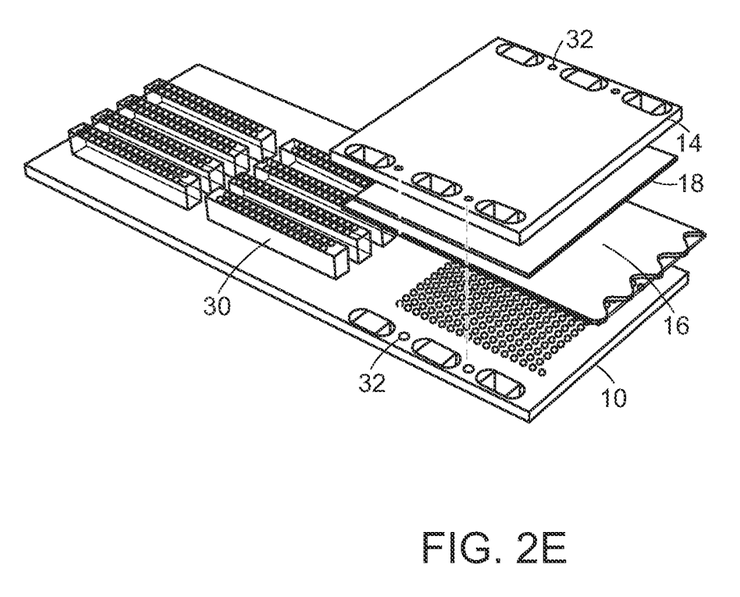

The soft MEA 16 is then aligned on the Polycarbonate top board 14 with spin-coated silicone rubber cushioning layer 18 (30 s, 1500 rpm recommended), using the aligning holes 32 previously made at the same positions of the MEA 16 and board as depicted in FIG. 2E. The top board 14 with MEA 16 laminated is aligned with the bottom PCB board, eventually forming a tight sandwich structure by the magnets.

Figure 2F:
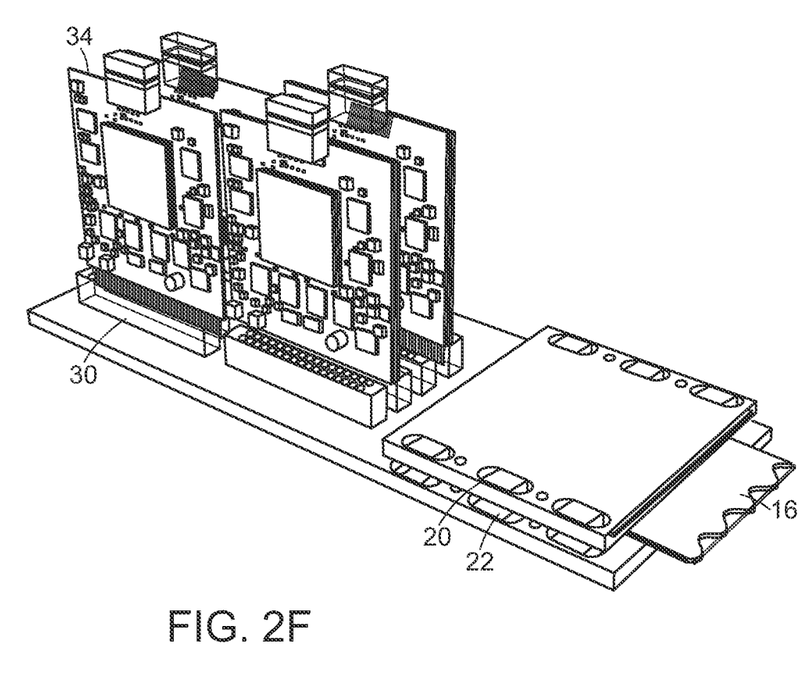
Figure 3:
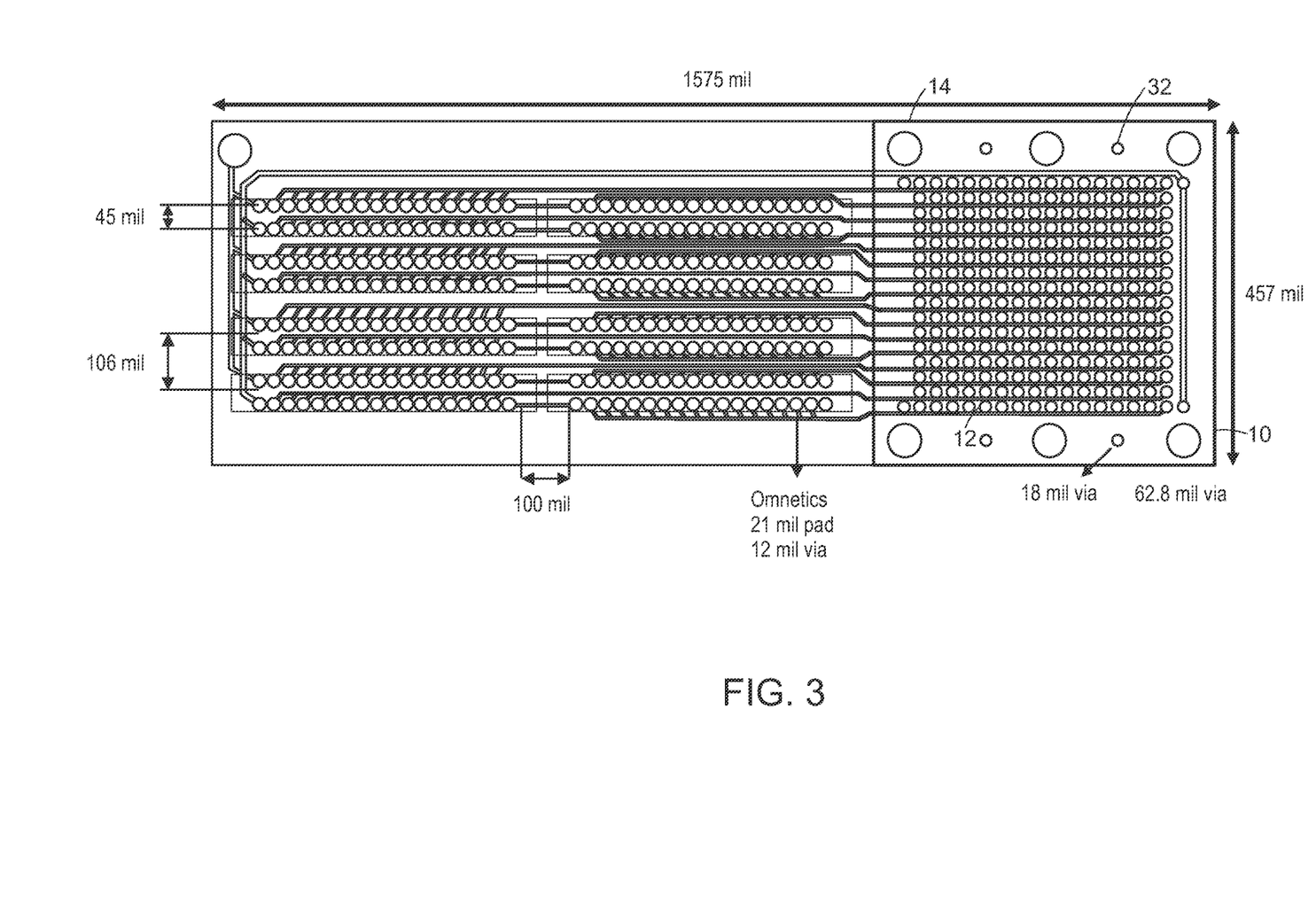
FIG. 3 illustrates the layout and dimensions of an exemplary soft neural interface connector in accordance with one or more embodiments.

Neural signal amplifier boards 34 (e.g., from Intan Technologies) are then inserted to enable the recording/stimulation as depicted in FIG. 2F FIG. 3 illustrates the layout and dimensions of an exemplary 256 soft neural interface connector in accordance with one or more embodiments. In this example, the size of the board 10 is 1575×457 mil$^2$. The pads 12 for soldering bumping have diameter of 16 mil. The vias inside the pads 12 are drilled with 8 mil in diameter. The PCB 10 has 16 layers of traces to minimize the footprint. The traces in this design are 4 mil in width. The magnets slots are made to be 63.8 mil in diameter. The holes left for alignment are 18 mil in diameter. The vias for Omnetics assembly (A79022-1) are 12 mil in diameter. The pitch of vias in the same connector is 25 mil. The transparent top board 14 is fabricated with the magnets slots and aligning holes 32 in the same positions as the PCB 10. The size of the top board 14 shown outlined is 457×457 mil$^2$.

Figure 4A:
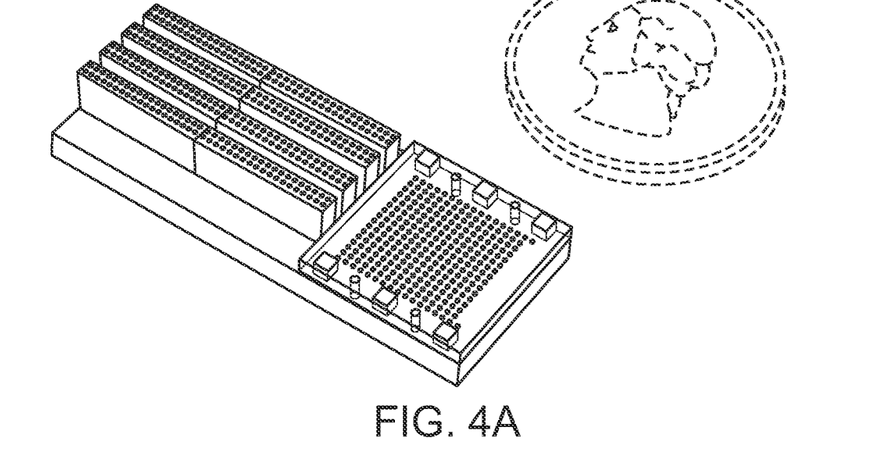
FIGS. 4A and 4B show two images of an exemplary soft neural interface connector in accordance with one or more embodiments.
Figure 4B:
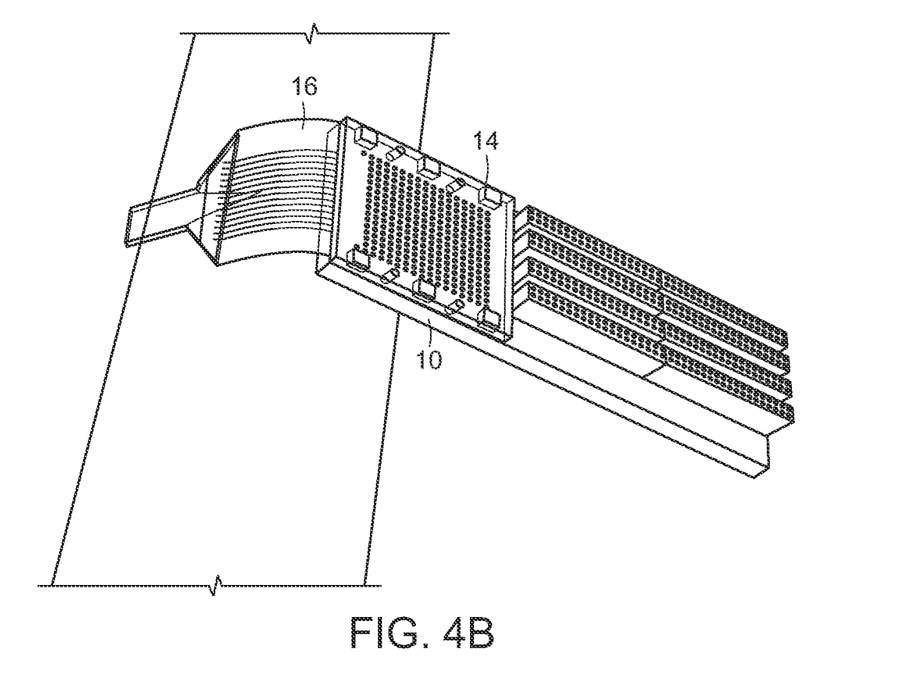

FIGS. 4A and 4B show two images of the 256-ch soft neural interface connector. FIG. 4A shows the connector without a soft MEA 16 with a quarter coin shown for size reference. FIG. 4B shows the device with a flexible MEA 16 fabricated on a Kapton substrate sandwiched between the PCB 10 and top board 14.

While the embodiments disclosed herein show a 256 channel connector, it should be understood that this is by way of example only; the invention applies to connectors of generally any size, including 256 channel connectors.

Figure 5:
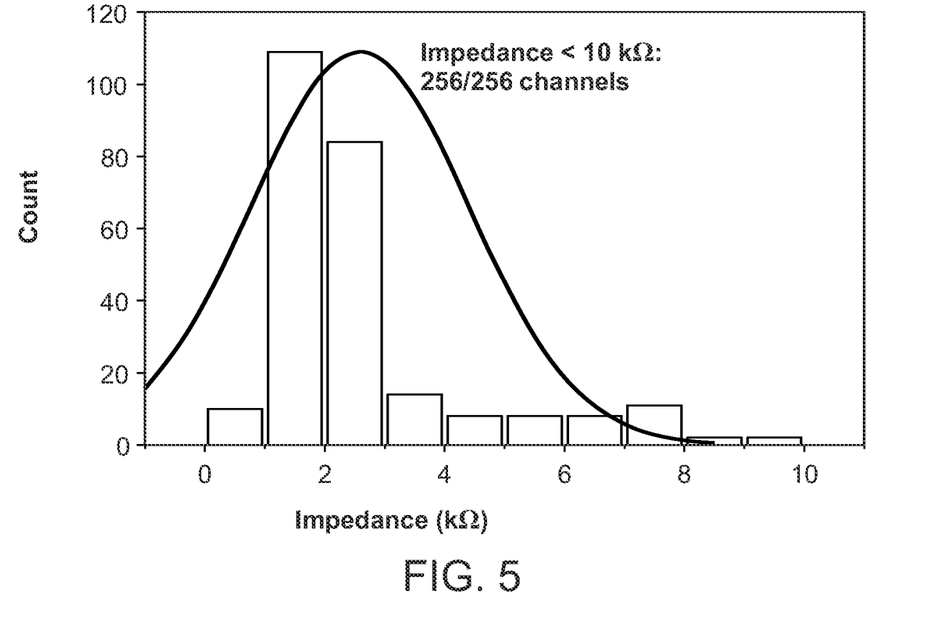
FIG. 5 is a graph showing impedance measurements of the microelectrode array using an exemplary soft neural interface connector in accordance with one or more embodiments.

FIGS. 5 and 6A-6C show the performance of the soft neural interface connector. FIG. 5 shows the impedance measurement using the soft neural interface connector with a thin Au film (30 nm) sandwiched. Impedance value were derived from Intan recording system. All 256 channels show ultra-low impedance (<10 kΩ).

Figure 6A:
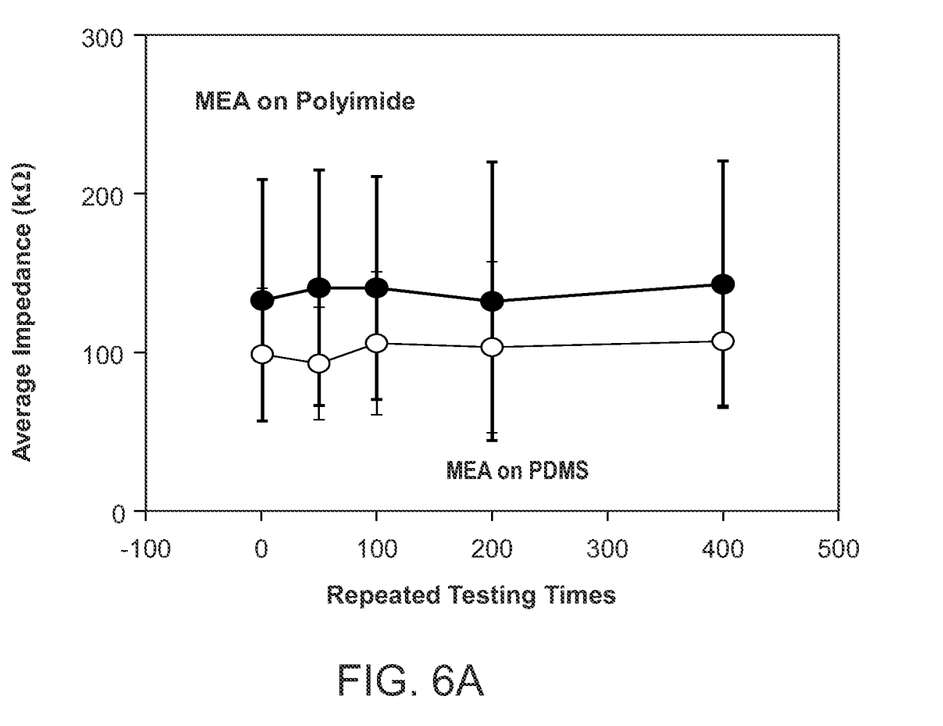
FIGS. 6A-6C are graphs demonstrating reusability of an exemplary soft neural interface connector in accordance with one or more embodiments.
Figure 6B:
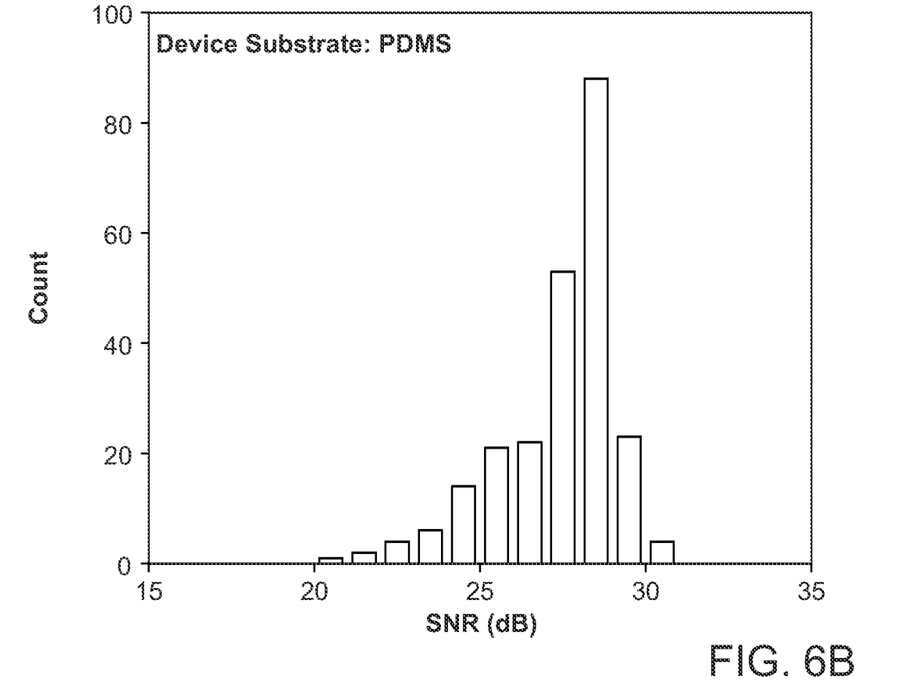
Figure 6C:
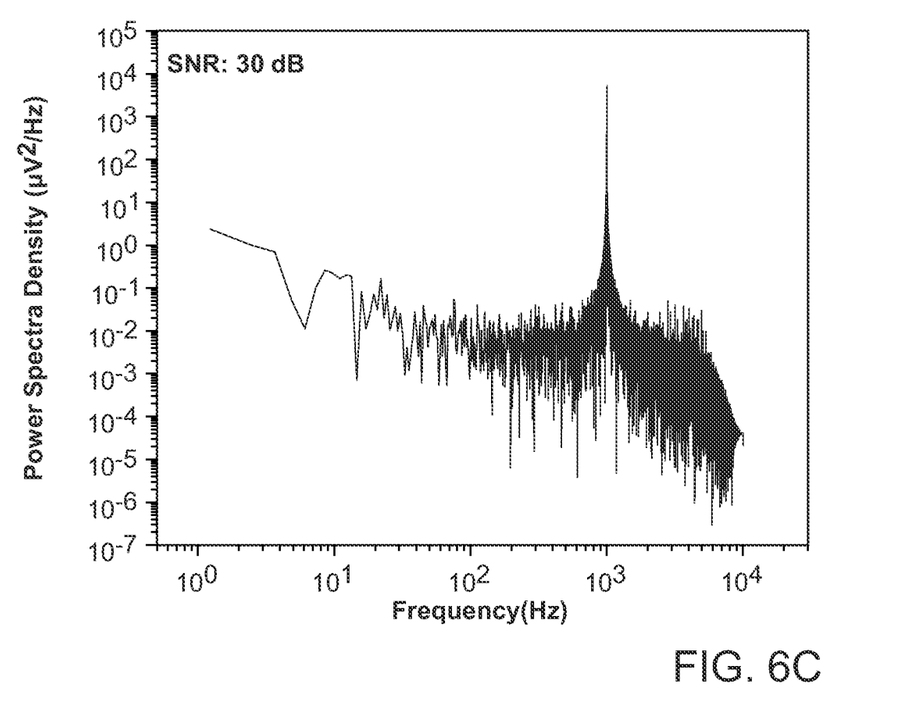

FIGS. 6A-6C demonstrated reusability of the soft neural interface connector using real MEA samples. Reusability is a significant advantage of the soft neural interface connector. Here, cyclic test of MEA impedance with up to 400 times of repeated plugging/unplugging was conducted, and the averaged impedance shows no change after repeated testing as depicted in FIG. 6A. A test sinewave signal of 110 µVrms, 1 kHz was recorded by the MEA and connector through a PBS solution. The SNR histogram of 256-ch flexible MEA fabricated on PDMS substrate demonstrates low SNR for over 90% of the channels as depicted in FIG. 6B. A detailed power spectra density of one recorded signal, the SNR of this specific channel is 30 dB, which refers to ~3.5 µV RMS noise is plotted in FIG. 6C.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions.

Accordingly, the foregoing description and attached drawings are by way of example only and are not intended to be limiting.

The invention claimed is:

1. A soft neural interface connector apparatus, comprising:
    a printed circuit board having a two-dimensional array of solder balls on one surface thereof;
    a transparent top board;
    a cushioning layer on one side of the transparent top board;
    a soft neural interface including a flexible and/or stretchable microelectrode array (MEA) through which neural signals are obtained or delivered, said MEA including a two-dimensional array of contact pads corresponding to the two-dimensional array of solder balls, wherein the printed circuit board, the transparent top board, the cushioning layer, and the MEA are stacked together such that the MEA is between the cushioning layer and the printed circuit board, wherein the contact pads in the array of contact pads are aligned with and in electrical contact with associated solder balls in the array of solder balls; and
    a magnetic connector system comprising at least one magnetic connector component on the transparent top board magnetically connected with at least one magnetic connector component on the printed circuit board to press the contact pads and associated solder balls together, wherein the magnetic connector system can be uncoupled to facilitate removal and replacement of the MEA with a different MEA.

2. The apparatus of claim 1, wherein the cushioning layer comprises a silicone rubber layer laminating the MEA on the printed circuit board.

3. The apparatus of claim 1, wherein the cushioning layer mitigates pressure applied by the magnetic connector system to the contact pads of the MEA.

4. The apparatus of claim 1, wherein the transparent top board comprises a polycarbonate material.

5. The apparatus of claim 1, wherein the transparent top board and the printed circuit board include alignment features to facilitate aligning the transparent top board to the printed circuit board.

6. The apparatus of claim 1, wherein the array of solder balls on the printed circuit board is connected by traces in the printed circuit board to one or more connectors in another area of the printed circuit board.

7. The apparatus of claim 6, further comprising one or more neural signal amplifier boards inserted in the one or more connectors.

8. The apparatus of claim 1, wherein the magnetic connector system enables the MEA to be removably connected to the printed circuit board such that the apparatus is reusable.

9. The apparatus of claim 1, wherein the MEA comprises Kapton, Parylene C, or Polydimethylsiloxane films.

10. The apparatus of claim 1, wherein the apparatus is configured for use in electrophysiology, neural stimulation, neurological disease treatment, or brain machine interface.

11. The apparatus of claim 1, wherein the magnetic connector components comprise permanent magnets or a combination of at least one permanent magnet and at least one ferromagnetic piece.

12. The apparatus of claim 1, wherein the magnetic connector components comprise a plurality of magnetic connector components on opposite sides of the transparent top board and the printed circuit board.

13. A method of removably connecting a neural interface to a printed circuit board, wherein the printed circuit board has a two-dimensional array of solder balls on one surface thereof, and wherein the neural interface includes a soft microelectrode array (MEA) through which neural signals are obtained or delivered, said MEA including a two-dimensional array of contact pads corresponding to the two-dimensional array of solder balls on the printed circuit board, the method comprising:

(a) applying a cushioning layer on one side of the transparent top board;
(b) stacking the printed circuit board, the MEA, and the transparent top board with the cushioning layer together such that the MEA is between the cushioning layer and the printed circuit board, and wherein the contact pads in the array of contact pads are aligned with and in electrical contact with associated solder balls in the array of solder balls; and
(c) magnetically securing the printed circuit board, the transparent top board with the cushioning layer, and the MEA together in a stacked arrangement to press the contact pads of the MEA and associated solder balls on the printed circuit board together.

14. The method of claim 13, wherein step (b) includes aligning the transparent top board to the printed circuit board using alignment features.

15. The method of claim 13, further comprising inserting one or more neural signal amplifier boards in one or more connectors on the printed circuit board connected to the array of solder balls by traces in the printed circuit board.

16. The method of claim 13, further comprising removing the MEA and replacing the MEA with a different MEA.

17. The method of claim 13, wherein the method is used in electrophysiology, neural stimulation, neurological disease treatment, or in a brain machine interface.

18. The method of claim 13, wherein magnetically securing the printed circuit board, the transparent top board with the cushioning layer, and the MEA together in a stacked arrangement comprises using a magnetic connector system comprising at least one magnetic connector component on the transparent top board magnetically connected with at least one magnetic connector component on the printed circuit board.

19. The method of claim 13, wherein the MEA comprises Kapton, Parylene C, or Polydimethylsiloxane films.

20. The method of claim 13, wherein the cushioning layer comprises a silicone rubber layer laminating the MEA on the printed circuit board.

* * * * *